(12) United States Patent
Noboru et al.

(10) Patent No.: US 12,417,951 B2
(45) Date of Patent: Sep. 16, 2025

(54) SEMICONDUCTOR DEVICE AND POWER CONVERSION DEVICE

(71) Applicant: Mitsubishi Electric Corporation, Tokyo (JP)

(72) Inventors: Wakana Noboru, Tokyo (JP); Hodaka Rokubuichi, Tokyo (JP); Kei Yamamoto, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 413 days.

(21) Appl. No.: 18/008,190

(22) PCT Filed: Jul. 14, 2020

(86) PCT No.: PCT/JP2020/027383
§ 371 (c)(1),
(2) Date: Dec. 5, 2022

(87) PCT Pub. No.: WO2022/013946
PCT Pub. Date: Jan. 20, 2022

(65) Prior Publication Data
US 2023/0282530 A1  Sep. 7, 2023

(51) Int. Cl.
*H01L 23/053* (2006.01)
*H01L 23/00* (2006.01)
(Continued)

(52) U.S. Cl.
CPC ........ *H01L 23/053* (2013.01); *H01L 23/3735* (2013.01); *H01L 24/32* (2013.01);
(Continued)

(58) Field of Classification Search
CPC ... H01L 23/053; H01L 23/3735; H01L 24/32; H01L 24/48; H01L 24/73;
(Continued)

(56) References Cited

U.S. PATENT DOCUMENTS 6,421,244 B1 * 7/2002 Shinohara ............... H01L 23/24
361/783
8,102,670 B2 * 1/2012 Sakamoto ............. H05K 1/144
361/792
(Continued)

FOREIGN PATENT DOCUMENTS

DE  102017206195 A1  10/2017
DE  102018203228 A1  10/2018
(Continued)

OTHER PUBLICATIONS

International Search Report and Written Opinion mailed on Oct. 20, 2020, received for PCT Application PCT/JP2020/027383, filed on Jul. 14, 2020, 9 pages including English Translation.
(Continued)

*Primary Examiner* — Peniel M Gumedzoe
(74) *Attorney, Agent, or Firm* — XSENSUS LLP

(57) ABSTRACT

A highly reliable semiconductor device and power conversion device are obtained. In the semiconductor device, a semiconductor element is mounted on a main surface of a base member. A case includes a side wall surrounding the base member. A support portion is formed on an inner peripheral surface of the side wall on a side of the base member. At least a part of the support portion is in contact with a contact region located inside an outer peripheral end of wiring board on a surface of the wiring board located on the side of the semiconductor element. A sealing member seals the semiconductor element and the wiring board. A terminal member is connected to a region of the wiring board closer to the outer peripheral end than the contact region. The terminal member includes an end portion protruding from a surface of the sealing member.

11 Claims, 9 Drawing Sheets

(51) Int. Cl.
*H01L 23/373* (2006.01)
*H02M 7/00* (2006.01)
*H05K 1/14* (2006.01)

(52) U.S. Cl.
CPC .............. *H01L 24/48* (2013.01); *H01L 24/73* (2013.01); *H02M 7/003* (2013.01); *H05K 1/144* (2013.01); *H01L 2224/32225* (2013.01); *H01L 2224/48227* (2013.01); *H01L 2224/73265* (2013.01); *H01L 2924/13055* (2013.01); *H01L 2924/13091* (2013.01); *H01L 2924/15787* (2013.01)

(58) Field of Classification Search
CPC . H01L 2224/32225; H01L 2224/48227; H01L 2224/73265; H01L 2924/13055; H01L 2924/13091; H01L 2924/15787; H02M 7/003; H05K 1/144
See application file for complete search history.

(56) References Cited

U.S. PATENT DOCUMENTS

| | | | |
|---|---|---|---|
| 9,136,193 B2* | 9/2015 | Minamio | .............. H01L 23/053 |
| 10,290,555 B2* | 5/2019 | Joko | .................... G01R 31/275 |
| 2009/0103276 A1 | 4/2009 | Sakamoto et al. | |
| 2018/0294201 A1 | 10/2018 | Kondo et al. | |

FOREIGN PATENT DOCUMENTS

| | | |
|---|---|---|
| JP | H10-270609 A | 10/1998 |
| JP | 2004-063604 A | 2/2004 |
| JP | 2006121861 A | 5/2006 |
| JP | 2009-081328 A | 4/2009 |
| JP | 2010-118699 A | 5/2010 |
| JP | 2018-181959 A | 11/2018 |
| JP | 2019-121719 A | 7/2019 |

OTHER PUBLICATIONS

Notice of Reasons for Refusal mailed on Apr. 13, 2021, received for JP Application 2021-505795, 6 pages including English Translation.
German Office Action issued Jul. 2, 2025, in corresponding German Patent Application No. 11 2020 007 426.9, 15pp.

* cited by examiner

SEMICONDUCTOR DEVICE AND POWER CONVERSION DEVICE

CROSS-REFERENCE TO RELATED APPLICATION

The present application is based on PCT filing PCT/JP2020/027383, filed Jul. 14, 2020, the entire contents of which are incorporated herein by reference.

TECHNICAL FIELD

The present disclosure relates to a semiconductor device and a power conversion device.

BACKGROUND ART

Conventionally, as the semiconductor device used for the power conversion device, there has been known a semiconductor device in which a wiring board is stacked on a semiconductor element, and the semiconductor element and the wiring board are sealed with a sealing member (for example, see Japanese Patent Laying-Open No. 2009-81328).

CITATION LIST

Patent Literature

PTL 1: Japanese Patent Laying-Open No. 2009-81328

SUMMARY OF INVENTION

Technical Problem

In the conventional semiconductor device, a terminal member such as a lead terminal connecting the wiring board and the outside is disposed so as to extend from the wiring board to the outside of the sealing member. In this case, there is a possibility that moisture enters the semiconductor device from an external environment along an interface between the terminal member and the sealing member. When the moisture intrudes into the semiconductor device as described above, the moisture may cause degradation or damage of the semiconductor element, leading to degradation of reliability of the semiconductor device.

The present disclosure has been made to solve the above problems, and an object of the present disclosure is to provide a semiconductor device and a power conversion device with high reliability.

Solution to Problem

A semiconductor device according to the present disclosure includes a base member, a semiconductor element, a case, a wiring board, a sealing member, and a terminal member. The base member includes a main surface. The semiconductor element is mounted on the main surface of the base member. The case includes a side wall surrounding the base member. A support portion is formed on an inner peripheral surface of the side wall on a base member side. The wiring board is disposed at a position overlapping with the semiconductor element when viewed from a direction perpendicular to the main surface of the base member. An electronic component is mounted on the wiring board. At least a part of the support portion is in contact with a contact region located inside an outer peripheral edge of the wiring board on a surface of the wiring board located on a semiconductor element side. The sealing member is disposed inside the case. The sealing member seals the semiconductor element and the wiring board. The terminal member is connected to a region on an outer peripheral edge side of the contact region in the wiring board. The terminal member includes an end portion protruding from a surface of the sealing member.

A power conversion device according to the present disclosure includes a main conversion circuit and a control circuit. The main conversion circuit includes the semiconductor device, and converts and outputs input power. The control circuit outputs a control signal controlling the main conversion circuit to the main conversion circuit.

Advantageous Effects of Invention

According to the above, the highly reliable semiconductor device and power conversion device can be obtained.

DESCRIPTION OF EMBODIMENTS

Figure 1:
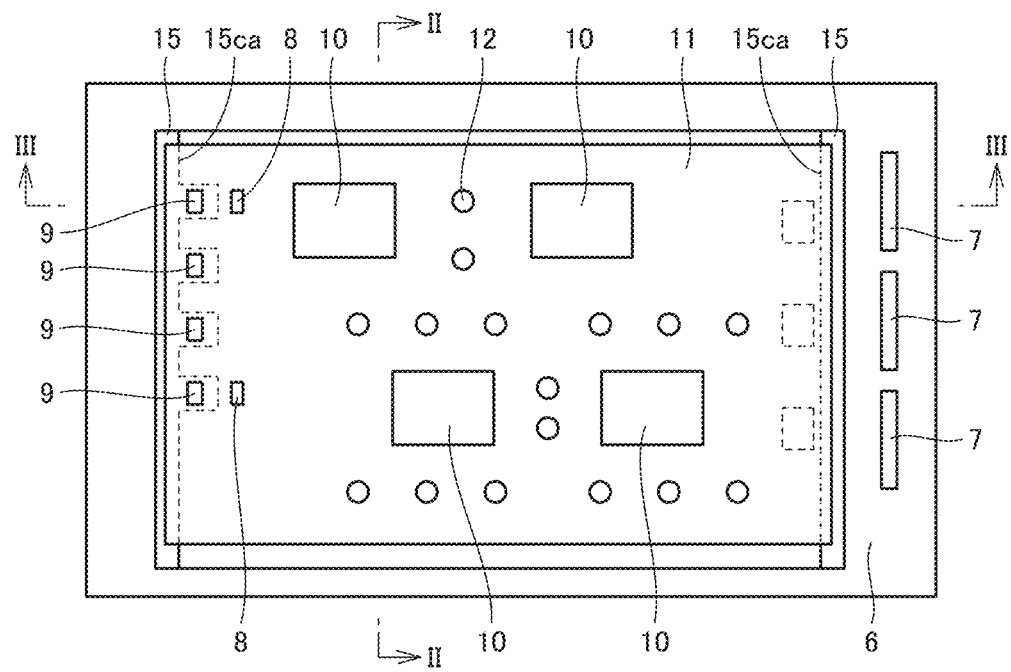
FIG. 1 is a schematic plan view illustrating a semiconductor device according to a first embodiment.

Hereinafter, embodiments of the present disclosure will be described. The same components are denoted by the same reference numerals, and a repetitive description will be omitted. The following drawings are schematic and may not reflect an exact size of an illustrated component.

First Embodiment

<Configuration of Semiconductor Device>

Figure 2:
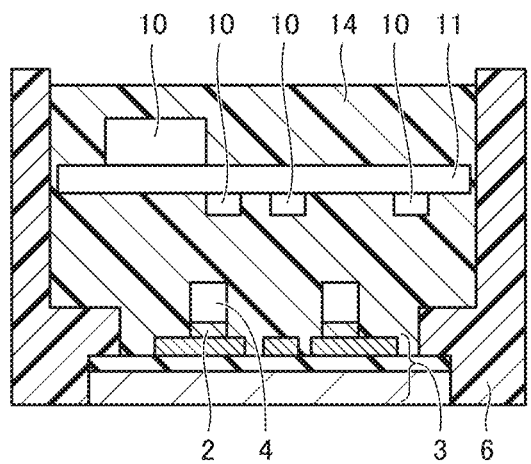
FIG. 2 is a schematic sectional view taken along a line II-II in FIG. 1.
Figure 3:
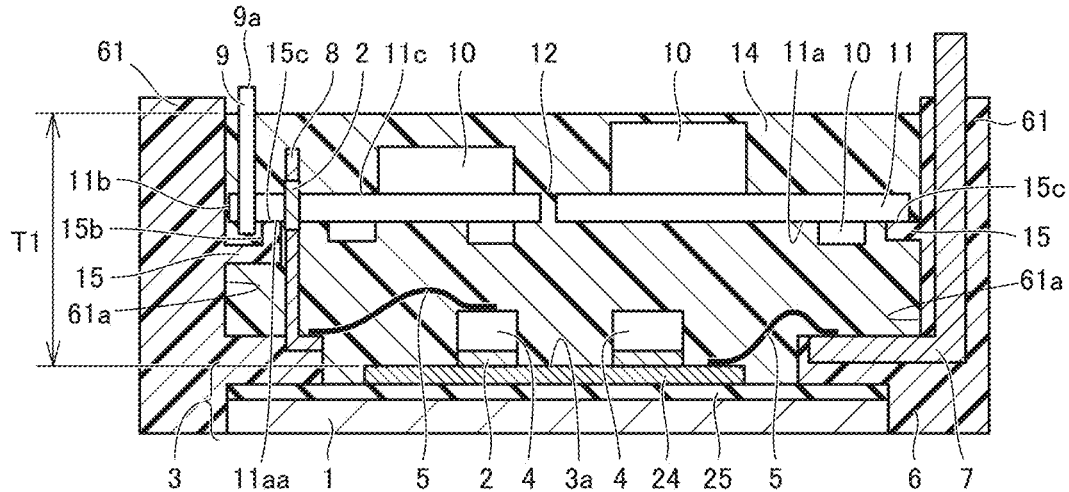
FIG. 3 is a schematic sectional view taken along a line III-III in FIG. 1.

FIG. 1 is a schematic plan view illustrating a semiconductor device according to a first embodiment. FIG. 2 is a schematic sectional view taken along a line II-II in FIG. 1. FIG. 3 is a schematic sectional view taken along a line III-III in FIG. 1. The semiconductor device in FIGS. 1 to 3 mainly includes a base member 3, a semiconductor element 4, a case 6, a wiring board 11, a sealing member 14, and a terminal member 9.

Base member 3 includes a heat dissipation layer 1, an insulating layer 25, and a conductor layer 24. Insulating layer 25 is laminated on heat dissipation layer 1 made of, for example, aluminum, copper, or the like. Conductor layer 24 as an upper electrode is disposed on insulating layer 25. An upper surface of conductor layer 24 configures a main surface 3a of base member 3. Insulating layer 25 is formed so as to cover the upper surface of heat dissipation layer 1. Insulating layer 25 can insulate only heat dissipation layer 1 and conductor layer 24 from each other, and may be formed only on a part of the upper surface of heat dissipation layer 1. Conductor layer 24 is formed so as to cover a part of the upper surface of insulating layer 25. A planar shape of base member 3 is a quadrangular shape. The planar shape of base member 3 may be a polygonal shape other than the quadrangular shape, or be a circular shape.

A material of insulating layer 25 is not particularly limited, but may be a resin material in which at least one of a fine particle and a filler is dispersed. For example, at least one of the fine particle and the filler may be formed of an inorganic ceramic material such as silica ($SiO_2$), alumina ($Al_2O_3$), aluminum nitride (AlN), boron nitride (BN), silicon nitride ($Si_3N_4$), diamond (C), silicon carbide (SiC), or boron oxide ($B_2O_3$). At least one of the fine particle and the filler may be formed of a resin material such as a silicone resin or an acrylic resin. The resin material in which at least one of the fine particle and the filler is dispersed has an electrical insulation property. The resin material in which at least one of the fine particle and the filler is dispersed is not particularly limited, but may be an epoxy resin, a polyimide resin, a silicone resin, or an acrylic resin.

Semiconductor element 4 is mounted on main surface 3a that is the upper surface of conductor layer 24 of base member 3. A plurality of semiconductor elements 4 are mounted on main surface 3a of base member 3. Semiconductor element 4 may be a power semiconductor element such as an insulated gate bipolar transistor (IGBT) or a metal oxide semiconductor field effect transistor (MOSFET), or be a diode such as a freewheel diode. A material constituting semiconductor element 4 may be silicon (Si), or a wide band gap semiconductor material such as silicon carbide (SiC), gallium nitride (GaN), or diamond. A required number of semiconductor elements 4 are fixed to the conductor layer 24 according to the use of the semiconductor device. In the plurality of semiconductor elements 4, the same type of semiconductor elements 4 may be included, or different types of semiconductor elements 4 may be included. The materials constituting the plurality of semiconductor elements 4 may be different from each other or may be the same material.

Semiconductor element 4 is bonded to conductor layer 24 by a bonding material 2 made of solder or the like. Any conductive material can be used as bonding material 2 in addition to the solder described above, but for example, silver or a silver alloy may be used.

Case 6 is disposed so as to surround an outer periphery of base member 3. Case 6 is connected to an outer peripheral portion of base member 3. Case 6 surrounds base member 3 and includes a side wall 61 extending in a direction intersecting with main surface 3a of base member 3. An opening is formed on an upper side of side wall 61 located on a side opposite to a lower side connected to base member 3. A size of the opening may be larger than a size of base member 3. A planar shape of the opening may be the same as a planar shape of base member 3. On the lower side of side wall 61, a part of case 6 is connected to base member 3 so as to cover the outer peripheral portion of base member 3. Specifically, a part of case 6 is connected to the outer peripheral portion of insulating layer 25 of base member 3. A part of case 6 is connected to insulating layer 25 of base member 3 and the outer peripheral end face of heat dissipation layer 1. Case 6 and base member 3 may be fixed by an adhesive or the like, and fixed by other means such as a screw.

A support portion 15 is formed on an inner peripheral surface 61a of side wall 61 on the side of base member 3. In a direction perpendicular to main surface 3a of base member 3, support portion 15 is disposed spaced apart from semiconductor element 4. In the semiconductor device in FIGS. 1 to 3, support portions 15 are formed on a pair of opposing side walls among side walls 61. Support portion 15 is preferably formed so as to surround semiconductor element 4 from at least two directions. Preferably, support portion 15 is formed so as to surround semiconductor element 4 from three directions. More preferably, support portion 15 is formed so as to surround semiconductor element 4 from all directions. A resin having the electrical insulation property such as an epoxy resin, a polyimide resin, an acrylic resin, or a polyphenylene sulfide (PPS) resin may be used as a material constituting case 6.

Wiring board 11 is disposed at a position overlapping with semiconductor element 4 when viewed from the direction perpendicular to main surface 3a of base member 3. That is, wiring board 11 is disposed on base member 3 and spaced apart from semiconductor element 4. An electronic component 10 is mounted on wiring board 11. Electronic component 10 is disposed on each of a surface 11a of wiring board 11 located on the side of semiconductor element 4 and the upper surface located on the opposite side of surface 11a. In addition, a through-hole 12 reaching surface 11a from the upper surface is made in wiring board 11. A plurality of through-holes 12 are made in wiring board 11. For example, a diameter of through-hole 12 is less than or equal to 1 mm. In this case, even when the inside of through-hole 12 is not filled with sealing member 14, there is no significant influence on the effect of preventing wiring board 11 from reaching semiconductor element 4 by moisture or the like. Wiring board 11 is supported by support portion 15 such that surface 11a of wiring board 11 is parallel to main surface 3a of base member 3. The size of surface 11c of wiring board 11 on which electronic component 10 is mounted may be larger than the size of conductor layer 24.

Terminal member 9 is connected to wiring board 11. A root portion of terminal member 9 is connected to the outer peripheral portion of wiring board 11. Terminal member 9 is preferably disposed at a position close to side wall 61 of case 6. An end portion 9a of terminal member 9 is disposed so as to protrude from the upper surface of sealing member 14. An internal connection terminal 8 is connected to wiring board 11. As illustrated in FIGS. 1 and 3, internal connection terminal 8 is connected to wiring board 11 inside terminal member 9 away from side wall 61 of case 6. Internal connection terminal 8 and wiring board 11 are electrically connected by a bonding material such as solder. In addition, terminal member 9 and wiring board 11 are also electrically connected by the bonding material such as solder. The bonding material may be protected by covering a connection portion between internal connection terminal 8 and wiring board 11 and a connection portion between terminal member 9 and wiring board 11 with resin. A lower end portion of internal connection terminal 8 opposite to an upper end portion connected to wiring board 11 is fixed to case 6. The lower end portion of internal connection terminal 8 is fixed to a portion covering the outer peripheral portion of base member 3 in case 6.

The outer peripheral portion of surface 11a of wiring board 11 is in contact with support portion 15, whereby wiring board 11 is supported by case 6. A support surface 15c that is the upper surface of support portion 15 is in contact with the outer peripheral portion of surface 11a of wiring board 11. Support portion 15 disposed under a region of wiring board 11 to which terminal member 9 is connected includes an extending portion extending from inner peripheral surface 61a of side wall 61 away from terminal member 9 and the outer peripheral portion of wiring board 11 and a contact portion extending from a distal end of the extending portion toward the side of wiring board 11. An upper end face of the contact portion is support surface 15c. Support surface 15c is in contact with surface 11a of wiring board 11. The region of wiring board 11 in contact with support surface 15c of support portion 15 is a contact region 11aa. That is, at least apart of support portion 15 is in contact with contact region 11aa located inside an outer peripheral edge 11b of wiring board 11 on surface 11a located on the side of semiconductor element 4 of wiring board 11. In other words, terminal member 9 is connected to the region of wiring board 11 closer to outer peripheral edge 11b than contact region 11aa. As a result, terminal member 9 is in a state of being received by support portion 15. A sectional shape of support portion 15 located directly below terminal member 9 may be an L-shape as illustrated in FIG. 3.

A recessed portion 15b facing the region of wiring board 11 to which terminal member 9 is connected is formed in support portion 15 located under terminal member 9. As a result, the outer peripheral portion of wiring board 11 to which terminal member 9 is connected is partitioned from the region on the side of semiconductor element 4 by support portion 15.

Support portion 15 is preferably in contact with as many portions as possible of the outer peripheral portion of wiring board 11. For example, support portion 15 may be formed on the entire circumference of inner peripheral surface 61a of side wall 61 of case 6. As illustrated in FIG. 1, support portion 15 is preferably formed on at least two opposing side walls 61.

Although the lower portion of terminal member 9 penetrates wiring board 11 in FIG. 3, when terminal member 9 is connected to wiring board 11 without penetrating wiring board 11, support portion 15 may be disposed immediately below terminal member 9. For example, support portion 15 may be in contact with surface 11a of wiring board 11 in the region located immediately below terminal member 9. When a protrusion amount of terminal member 9 from surface 11a of wiring board 11 is relatively small while terminal member 9 penetrates wiring board 11, for example, a recess may be formed in support surface 15c of support portion 15 and the end portion of terminal member 9 may be received in the recess. Case 6 in the semiconductor device in FIG. 3 includes support portion 15 having a left-right asymmetric shape according to the disposition of wiring board 11 and terminal member 9, but the shape of support portion 15 may be a left-right symmetric shape in FIG. 3.

One of semiconductor elements 4 is electrically connected to internal connection terminal 8 by a conductive wire 5. An external connection terminal 7 is embedded in case 6. The lower portion of external connection terminal 7 is exposed to the surface of case 6 in the region overlapping with base member 3. The upper portion of external connection terminal 7 protrudes from a top surface of side wall 61 of case 6. Conductor layer 24 to which semiconductor element 4 is fixed and the lower portion of external connection terminal 7 are connected by conductive wire 5. Semiconductor element 4 is electrically connected to external connection terminal 7 by conductive wire 5. The material of conductive wire 5 is not particularly limited, but a metal material such as copper or aluminum can be used.

Sealing member 14 is disposed inside case 6. Sealing member 14 seals conductor layer 24 of base member 3, semiconductor element 4, wiring board 11, electronic component 10, internal connection terminal 8, and conductive wire 5. Sealing member 14 has the electrical insulation property and insulates the sealed members. A thickness T1 of sealing member 14 is large enough to allow both semiconductor element 4 and electronic component 10 mounted on wiring board 11 to be embedded.

In the semiconductor device, water vapor transmission rates of the materials constituting wiring board 11 and case 6 may be lower than a water vapor transmission rate of sealing member 14. In this case, because the region where semiconductor element 4 is disposed is surrounded by wiring board 11 and case 6, the possibility that the moisture or the like reaches semiconductor element 4 can be decreased. Because the contact portion between support portion 15 and wiring board 11 serves as a seal portion, support portion 15 is preferably disposed so as to surround the region from at least two directions. The water vapor transmission rate is measured by, for example, a moisture sensor method defined in JIS standard K7126-1.

The material of sealing member 14 is preferably an epoxy resin, but is not limited thereto, and for example, an insulating resin such as a silicone resin, a urethane resin, a polyimide resin, a polyamide resin, or an acrylic resin may be used. The material constituting sealing member 14 may be an insulating resin material in which the fine particles or fillers improving strength and thermal conductivity of sealing member 14 are dispersed. For example, the fine particle or filler improving the strength and thermal conductivity of sealing member 14 may be formed of an inorganic ceramic material such as silica ($SiO_2$), alumina ($Al_2O_3$), aluminum nitride (AlN), boron nitride (BN), silicon nitride ($Si_3N_4$), diamond (C), silicon carbide (SiC), or boron oxide ($B_2O_3$).

<Method for Manufacturing Semiconductor Device>

A method for manufacturing the semiconductor device in FIGS. 1 to 3 will be described.

First, a process (S10) of preparing members constituting a semiconductor device is performed. In this process (S10), members constituting the semiconductor device are prepared, members including base member 3, semiconductor element 4, case 6, wiring board 11 on which electronic component 10 is mounted, and sealing member 14.

Subsequently, a process (S20) of bonding semiconductor element 4 to base member 3 is performed. In this process (S20), solder as bonding material 2 and semiconductor element 4 are disposed on base member 3. Thereafter, the solder is melted by reflow heating and then solidified to bond semiconductor element 4 to base member 3.

Subsequently, a process (S30) of bonding case 6 to base member 3 is performed. In this process (S30), an adhesive (not illustrated) is uniformly applied to the outer peripheral portion of base member 3 to which semiconductor element 4 is soldered. Case 6 is brought into contact with the portion to which the adhesive is applied, and case 6 and base member 3 adhere to each other. Here, as illustrated in FIGS. 1 and 3, case 6 includes an external connection terminal 7 and internal connection terminal 8. External connection terminal 7 is drawn out of the semiconductor device through the inside of case 6. As illustrated in FIG. 3, internal connection terminal 8 is disposed so as to extend upward (along side wall 61) from the lower portion of case 6.

Subsequently, a process (S40) of forming a circuit is performed. In this process (S40), semiconductor element 4, conductor layer 24 of base member 3, external connection terminal 7, internal connection terminal 8, and the like are electrically connected using conductive wire 5 to form the circuit.

Subsequently, a process (S50) of disposing wiring board 11 is performed. In this process (S50), wiring board 11 is disposed inside case 6 such that support surface 15c of support portion 15 formed on side wall 61 of case 6 comes into contact with the outer peripheral portion of lower surface 11a of wiring board 11. Wiring board 11 is disposed at a position where wiring board 11 and the distal end of internal connection terminal 8 can be bonded. At this time, the contact area between support surface 15c and wiring board 11 is preferably as wide as possible. Support surface 15c is preferably in contact with the entire periphery of the outer peripheral portion of wiring board 11. As illustrated in at least FIGS. 1 and 3, preferably support surface 15c and wiring board 11 is in contact with each other on two opposing sides of the outer peripheral portion of wiring board 11.

Subsequently, a soldering process (S60) is performed. In this process (S60), the lower portion of terminal member 9 for external connection is disposed at a position bonded to wiring board 11. Then, wiring board 11 and internal connection terminal 8 are electrically connected by soldering. In addition, wiring board 11 and terminal member 9 are electrically connected by soldering.

Subsequently, a sealing process (S70) is performed. In this process (S70), the sealing resin as sealing member 14 is injected into the region below wiring board 11 from the portion where wiring board 11 is not supported by support portion 15. Furthermore, sealing member 14 is injected into case 6 so as to embed all electronic components 10 of wiring board 11. As a result, sealing member 14 is disposed so as to embed bonding material 2 such as solder, conductor layer 24, semiconductor element 4, conductive wire 5, internal connection terminal 8, electronic component 10, wiring board 11, support portion 15 formed on inner peripheral surface 61a of side wall 61 of case 6, and the connection portion between support portion 15 and wiring board 11. As a result, the semiconductor device in FIGS. 1 to 3 can be obtained.

Advantageous Effect

The semiconductor device of the present disclosure includes base member 3, semiconductor element 4, case 6, wiring board 11, sealing member 14, and terminal member 9. Base member 3 include main surface 3a. Semiconductor element 4 is mounted on main surface 3a of base member 3. Case 6 includes side wall 61 surrounding base member 3. A support portion 15 is formed on an inner peripheral surface 61a of side wall 61 on the side of base member 3. Wiring board 11 is disposed at a position overlapping with semiconductor element 4 when viewed from the direction perpendicular to main surface 3a of base member 3. An electronic component 10 is mounted on wiring board 11. At least a part of support portion 15 is in contact with contact region 11aa located inside outer peripheral edge 11b of wiring board 11 on surface 11a located on the side of semiconductor element 4 of wiring board 11. Sealing member 14 is disposed inside case 6. Sealing member 14 seals semiconductor element 4 and wiring board 11. Terminal member 9 is connected to the region of wiring board 11 closer to outer peripheral edge 11b than contact region 11aa. Terminal member 9 includes end portion 9a protruding from the surface of sealing member 14.

In this way, wiring board 11 sealed by sealing member 14 is disposed on semiconductor element 4, a path length through which a substance such as the moisture or sulfur gas enters from the outside from the surface of sealing member 14 to semiconductor element 4 can be increased as compared with the case where wiring board 11 does not exist. In addition, terminal member 9 is connected to the outer peripheral side of contact region 11aa with which support portion 15 is in contact in wiring board 11, so that the possibility that the substance such as the moisture reaches semiconductor element 4 from the outside through the contact interface between terminal member 9 and sealing member 14 can be decreased as compared with the case where the terminal member 9 extends from the vicinity of the semiconductor element 4 to the outside of the sealing member 14.

Here, a case where a substance such as moisture reaches the outer peripheral portion of the wiring board 11 from the outside through the contact interface between the terminal member 9 and the sealing member 14 is considered. In this case, because support portion 15 is in contact with contact region 11aa of wiring board 11 between the outer peripheral portion and semiconductor element 4, the contact interface between wiring board 11 and support portion 15 and sealing member 14 is formed. The contact interface traps the substance such as the moisture reaching the outer peripheral portion of wiring board 11, and as a result, the possibility that the substance such as the moisture reach semiconductor element 4 can be decreased. As a result, the reliability of the semiconductor device can be improved.

In the semiconductor device, the water vapor transmission rates of the materials constituting wiring board 11 and case 6 may be smaller than the water vapor transmission rate of sealing member 14.

In this case, because wiring board 11 having the relatively low water vapor transmission rate is embedded on semiconductor element 4 inside sealing member 14, wiring board 11 acts as the member that prevents water from entering from the outside toward semiconductor element 4 from the upper surface of sealing member 14 or a member that increases a water entry path length. Thus, the possibility that the substance such as the water reaches semiconductor element 4 can be decreased.

In the semiconductor device, base member 3 may include conductor layer 24 to which semiconductor element 4 is connected. The size of surface 11c of wiring board 11 on which electronic component 10 is mounted may be larger than the size of conductor layer 24.

In this case, wiring board 11 disposed in sealing member 14 can sufficiently increase the length of the entry path of the substance such as the water from the upper surface of sealing member 14.

In the semiconductor device, at least a part of support portion 15 may include recessed portion 15b facing the region of wiring board 11 to which terminal member 9 is connected. In this case, recessed portion 15b of support portion 15 can form the seal portion that surrounds the region of wiring board 11 to which terminal member 9 is connected. Therefore, the substance such as the water can be prevented from entering the side of semiconductor element 4 through a bonded interface between terminal member 9 and sealing member 14 by the seal portion.

In the semiconductor device, base member 3 may include heat dissipation layer 1. The material constituting heat dissipation layer 1 may be metal. For example, in the semiconductor device, base member 3 may include conductor layer 24 and heat dissipation layer 1. Semiconductor element 4 is connected to conductor layer 24. Heat dissipation layer 1 is connected to conductor layer 24 with insulating layer 25 interposed therebetween. The material constituting heat dissipation layer 1 may be metal.

In this case, because base member 3 includes heat dissipation layer 1, the configuration of the semiconductor device can be simplified as compared with the case where the heat dissipation layer is connected to base member 3 as a separate member.

In the semiconductor device, support portion 15 may be in contact with wiring board 11 in at least two directions of the outer peripheral portion of wiring board 11. In this case, the contact portion between support portion 15 and wiring board 11 acts as the seal portion, and the possibility that the substance such as the water enters semiconductor element 4 from the upper surface of sealing member 14 can be decreased.

In addition, as illustrated in FIGS. 1 and 3, preferably the component such as electronic component 10 is not exposed on the upper surface of sealing member 14 inside a support surface end portion 15ca located on the distal end side of support portion 15. In this case, the connection interface between electronic component 10 and sealing member 14 is not exposed on the upper surface of sealing member 14 inside support surface end portion 15ca. Accordingly, generation of the problem that atmospheric gas such as water vapor and sulfur gas enters the inside of the semiconductor device through the connection interface can be prevented. In addition, wiring board 11 is disposed inside sealing member 14 and above semiconductor element 4, so that the entry path length of the gas that can be formed from the upper surface of sealing member 14 to semiconductor element 4 can be lengthened. As a result, the possibility that the moisture or the like reaches semiconductor element 4 to generate a defect can be decreased without requiring a special additional member, and a highly reliable semiconductor device can be obtained.

<Configuration and Advantageous Effect of Modification>

Figure 4:
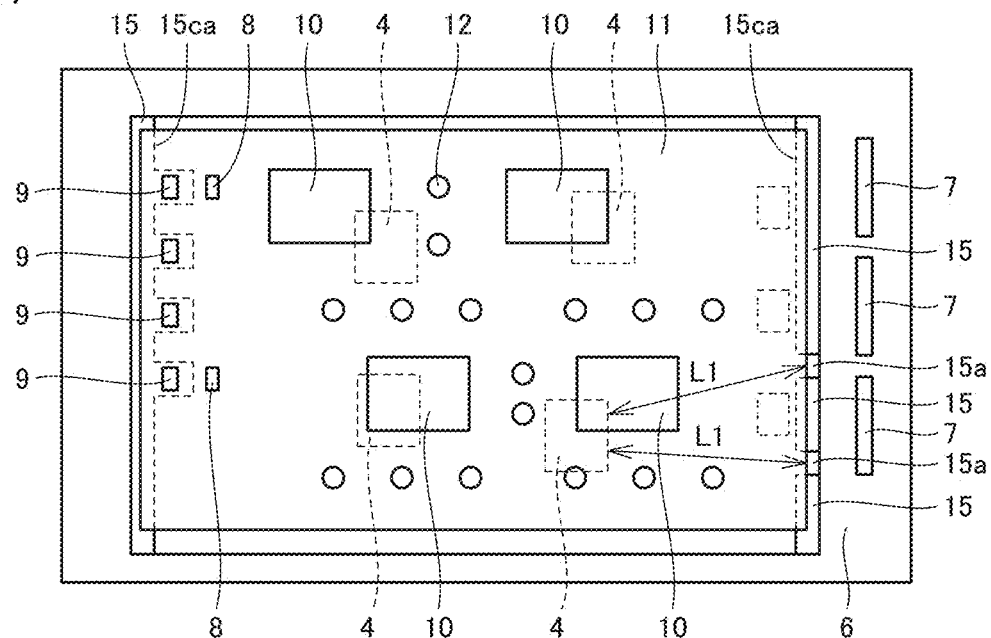
FIG. 4 is a schematic plan view illustrating a modification of the semiconductor device of the first embodiment.

FIG. 4 is a schematic plan view illustrating a modification of the semiconductor device of the first embodiment. FIG. 4 corresponds to FIG. 1. The semiconductor device in FIG. 4 basically includes the same configuration as the semiconductor device in FIGS. 1 to 3, but the configuration of support portion 15 is different from that of the semiconductor device in FIGS. 1 to 3. Specifically, a notch 15a in which a part of support portion 15 is missing is formed in the semiconductor device in FIG. 4. A distance L1 from notch 15a to semiconductor element 4 is preferably larger than thickness T1 of sealing member 14.

Even with such the configuration, the same effects as those of the semiconductor device in FIGS. 1 to 3 can be obtained. In addition, when sealing member 14 is supplied into case 6 in the method for manufacturing the semiconductor device, sealing member 14 can be supplied to the region between wiring board 11 and semiconductor element 4 through notch 15a. In addition, distance L1 from notch 15a to semiconductor element 4 in planar view (when viewed from the direction perpendicular to main surface 3a of base member 3) is larger than thickness T1 (see FIG. 1) of sealing member 14, so that an increase in the possibility that the substance such as the water enters semiconductor element 4 from the upper surface of sealing member 14 due to the formation of notch 15a can be prevented.

Second Embodiment

<Configuration of Semiconductor Device>

Figure 5:
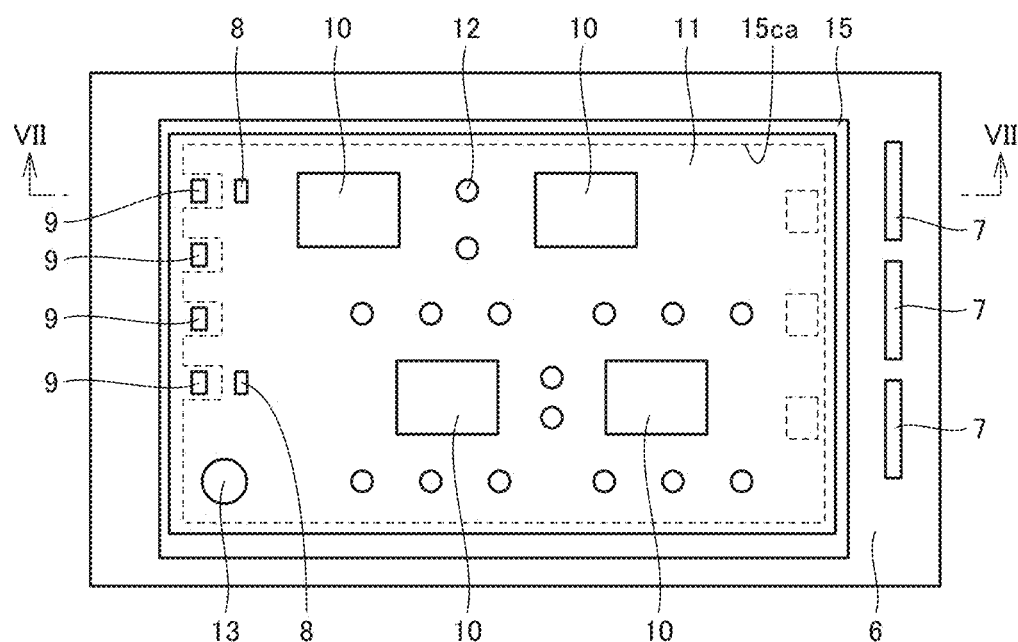
FIG. 5 is a schematic plan view illustrating a semiconductor device according to a second embodiment.
Figure 6:
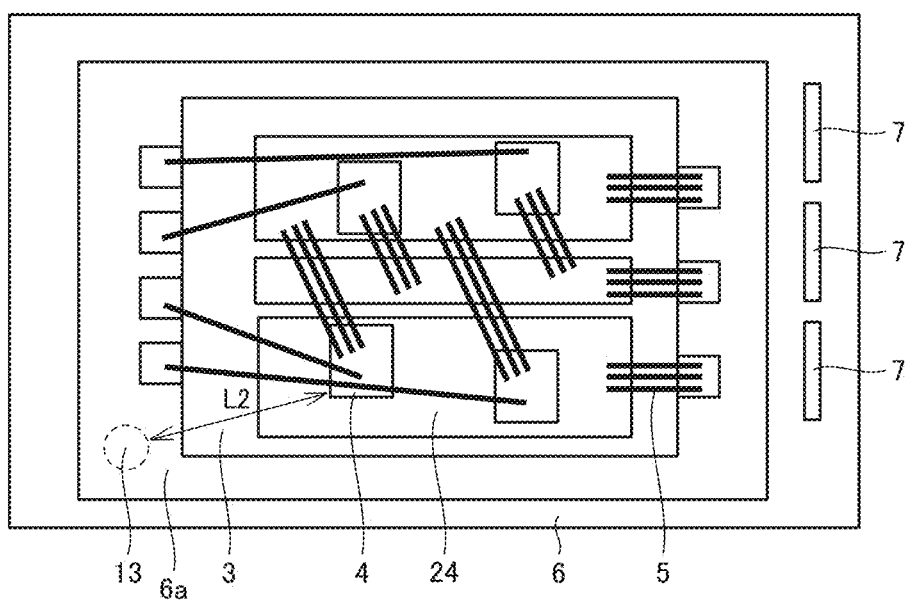
FIG. 6 is a schematic plan view illustrating a positional relationship between a sealing member inlet port and an insulating member in the semiconductor device in FIG. 5.
Figure 7:
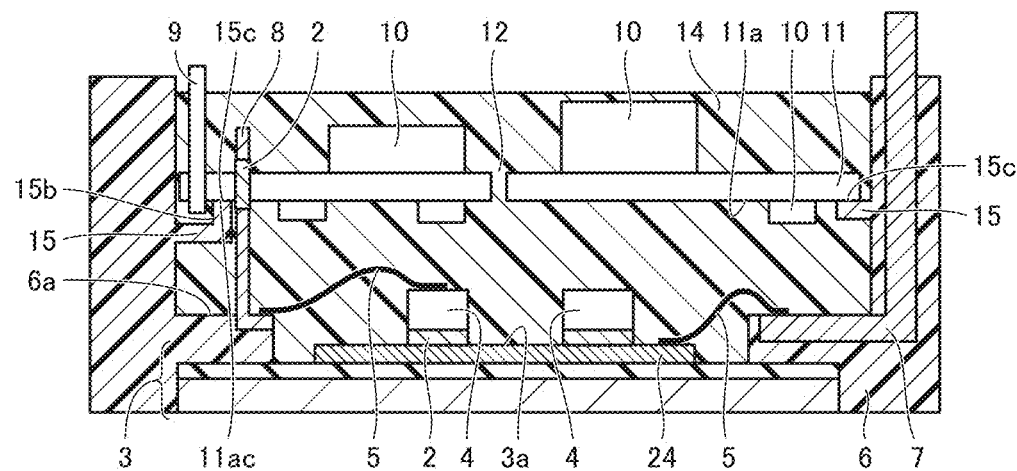
FIG. 7 is a schematic sectional view taken along a line VII-VII in FIG. 5.

FIG. 5 is a schematic plan view illustrating a semiconductor device according to a second embodiment. FIG. 6 is a schematic plan view illustrating a positional relationship between a sealing member inlet port and an insulating member in the semiconductor device in FIG. 5. FIG. 6 schematically illustrates disposition of base member 3, semiconductor element 4, and conductive wire 5 located below wiring board 11 in FIG. 5. FIG. 7 is a schematic sectional view taken along a line VII-VII in FIG. 5. FIG. 5 corresponds to FIG. 1, and FIG. 7 corresponds to FIG. 3.

The semiconductor device in FIGS. 5 to 7 basically has the same configuration as the semiconductor device in FIGS. 1 to 3, but is different from the semiconductor device in FIGS. 1 to 3 in that sealing member inlet port 13 is formed in wiring board 11 and in the configuration of support portion 15. Here, a hole that penetrates wiring board 11 from surface 11a, which is the back surface, to the upper surface does not insert the electronic component, but has a diameter of at least 1 mm is defined as sealing member inlet port 13. In planar view in FIGS. 5 and 6 (when viewed from the direction perpendicular to main surface 3a of base member 3), sealing member inlet port 13 is formed at the position overlapping with case 6. More specifically, sealing member inlet port 13 in wiring board 11 is formed at the position overlapping with case surface 6a that is the upper surface of the portion extending on the outer peripheral portion of base member 3 in case 6. That is, sealing member inlet port 13 is disposed at the position not overlapping with conductor layer 24 of base member 3 in planar view.

Although it is ideal that sealing member inlet port 13 exists at the position farthest from conductor layer 24, at least a distance L2 between sealing member inlet port 13 and conductor layer 24 is preferably greater than or equal to thickness T1 (see FIG. 1) of sealing member 14 in planar view of FIG. 6. As described above, sealing member inlet port 13 is not provided on conductor layer 24, but sealing member inlet port 13 is provided at the position separated from conductor layer 24 by at least thickness T1 of sealing member 14, so that gas such as water vapor or sulfur gas can be prevented from reaching semiconductor element 4 from the upper surface of sealing member 14.

In the semiconductor device described above, sealing member inlet port 13 is formed in wiring board 11, so that sealing member 14 can be injected from sealing member inlet port 13 to the lower side of wiring board 11. Accordingly, support portion 15 is formed so as to surround the entire periphery of wiring board 11 so as to be in contact with the entire outer periphery of wiring board 11. That is, support portion 15 is formed in an annular shape in planar view so as to go around the inner peripheral surface of the side wall of case 6.

<Method for Manufacturing Semiconductor Device>

The method for manufacturing the semiconductor device in FIGS. 5 to 7 is basically similar to the method for manufacturing the semiconductor device in FIGS. 1 to 3, but the configuration of wiring board 11 and the content of the sealing process (S70) are different from those of the method for manufacturing the semiconductor device in FIGS. 1 to 3. Specifically, sealing member inlet port 13 is formed in wiring board 11 prepared in the preparation process (S10). Sealing member inlet port 13 may be formed at the end portion of wiring board 11. Thereafter, the processes (S20) to (S60) in the method for manufacturing the semiconductor device in FIGS. 1 to 3 are performed. Then, in the sealing process (S70), the resin material or the like as the sealing member is injected into the lower side of wiring board 11 through sealing member inlet port 13. In this way, the semiconductor device in FIGS. 5 to 7 can be obtained.

Advantageous Effect

In the semiconductor device, sealing member inlet port 13 may be formed in wiring board 11. When viewed from the direction perpendicular to main surface 3a of base member 3, sealing member inlet port 13 may be formed at the position overlapping with case 6.

In this case, in addition to the same effect as that of the semiconductor device in FIGS. 1 to 3, sealing member 14 can be easily injected to the lower side of wiring board 11 through sealing member inlet port 13. In addition, distance L2 between conductor layer 24 configuring base member 3 and sealing member inlet port 13 is set larger than thickness T1 of sealing member 14, so that the substances such as the moisture and the gas can be prevented from reaching conductor layer 24 and semiconductor element 4 from the upper surface of sealing member 14 through sealing member inlet port 13.

Third Embodiment

<Configuration of Semiconductor Device>

Figure 8:
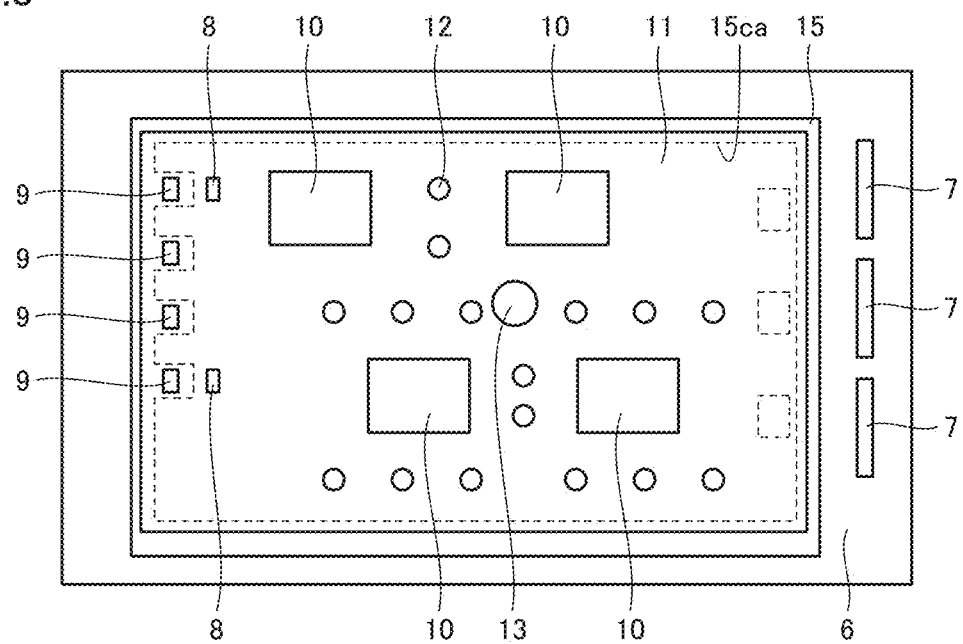
FIG. 8 is a sectional plan view illustrating a semiconductor device according to a third embodiment.
Figure 9:
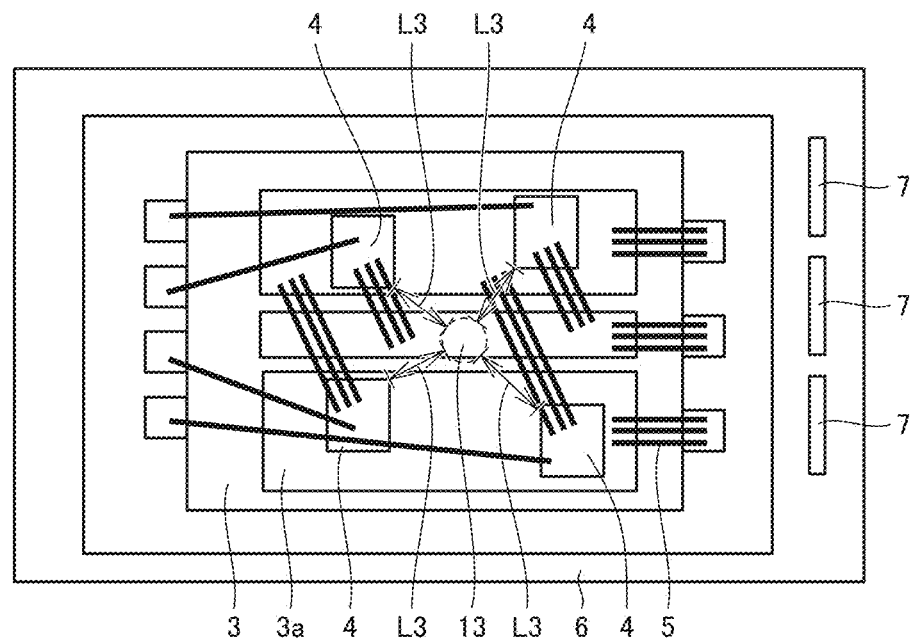
FIG. 9 is a schematic plan view illustrating a positional relationship between a sealing member inlet port and a semiconductor element in the semiconductor device in FIG. 8.

FIG. 8 is a sectional plan view illustrating a semiconductor device according to a third embodiment. FIG. 9 is a schematic plan view illustrating a positional relationship between the sealing member inlet port and the semiconductor element in the semiconductor device in FIG. 8. FIG. 8 corresponds to FIG. 5, and FIG. 9 corresponds to FIG. 6. The semiconductor device in FIGS. 8 and 9 basically has the same configuration as the semiconductor device in FIGS. 5 to 7, but has the position different from that of sealing member inlet port 13 in wiring board 11. Specifically, sealing member inlet port 13 is formed in the central portion of wiring board 11. In planar view in FIGS. 8 and 9 (when viewed from the direction perpendicular to main surface 3a of base member 3), sealing member inlet port 13 is disposed in the region not overlapping with semiconductor element 4.

Although it is ideal that sealing member inlet port 13 exists at the position farthest from semiconductor element 4, at least a distance L3 between sealing member inlet port 13 and semiconductor element 4 is preferably greater than or equal to thickness T1 (see FIG. 1) of sealing member 14 in planar view of FIG. 9. As described above, sealing member inlet port 13 is not provided on semiconductor element 4, and sealing member inlet port 13 is provided at least at the position separated from semiconductor element 4 by thickness T1 of sealing member 14, so that the gas such as the water vapor or the sulfur gas can be prevented from reaching semiconductor element 4 from the upper surface of sealing member 14 through sealing member inlet port 13.

<Method for Manufacturing Semiconductor Device>

The method for manufacturing the semiconductor device in FIGS. 8 and 9 is basically similar to the method for manufacturing the semiconductor device in FIGS. 1 to 3, but the configuration of wiring board 11 and the content of the sealing process (S70) are different from those of the method for manufacturing the semiconductor device in FIGS. 1 to 3. Specifically, sealing member inlet port 13 is formed in the central portion of wiring board 11 prepared in the preparation process (S10). Thereafter, the processes (S20) to (S60) in the method for manufacturing the semiconductor device in FIGS. 1 to 3 are performed. Then, in the sealing process (S70), the resin material or the like as the sealing member is injected into the lower side of wiring board 11 through sealing member inlet port 13. In this way, the semiconductor device in FIGS. 8 and 9 can be obtained.

Advantageous Effect

In the semiconductor device, sealing member inlet port 13 may be formed in wiring board 11. When viewed from the direction perpendicular to main surface 3a of base member 3, sealing member inlet port 13 may be formed at the position not overlapping with semiconductor element 4.

In this case, in addition to the same effect as that of the semiconductor device in FIGS. 1 to 3, sealing member 14 can be easily injected to the lower side of wiring board 11 through sealing member inlet port 13. In addition, distance L3 between semiconductor element 4 and sealing member inlet port 13 is set larger than thickness T1 of sealing member 14, the substance such as the moisture and the gas can be prevented from reaching semiconductor element 4 from the upper surface of sealing member 14 through sealing member inlet port 13.

Fourth Embodiment

<Configuration of Semiconductor Device>

Figure 10:
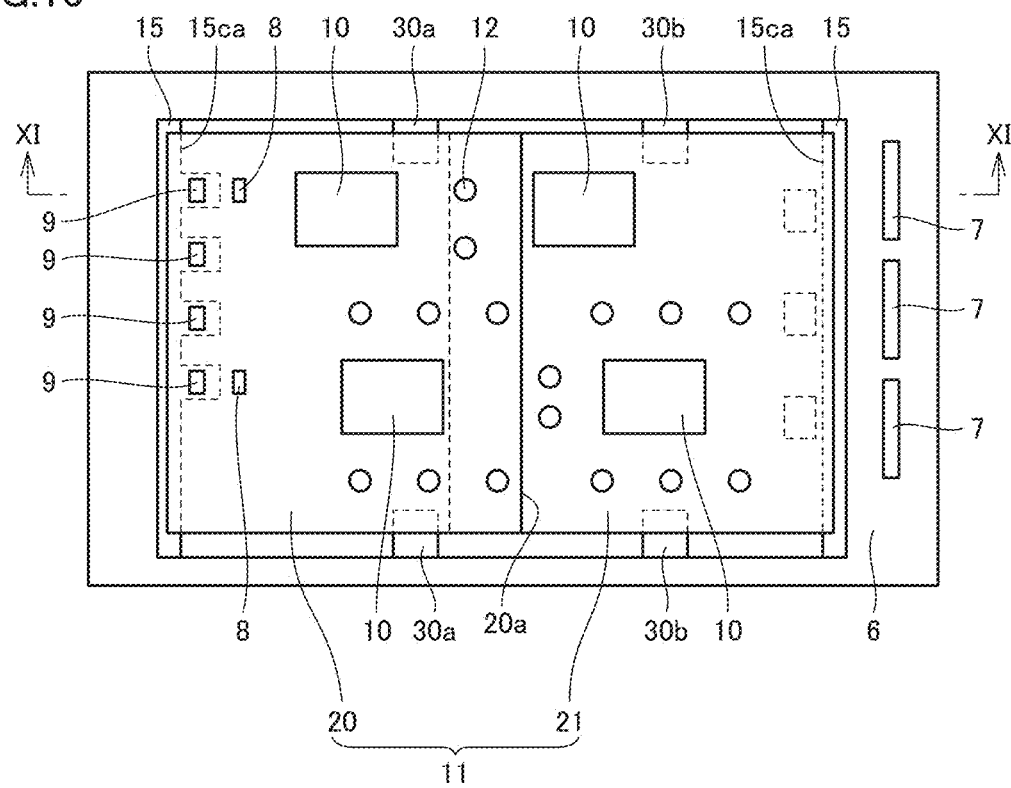
FIG. 10 is a sectional plan view illustrating a semiconductor device according to a fourth embodiment.
Figure 11:
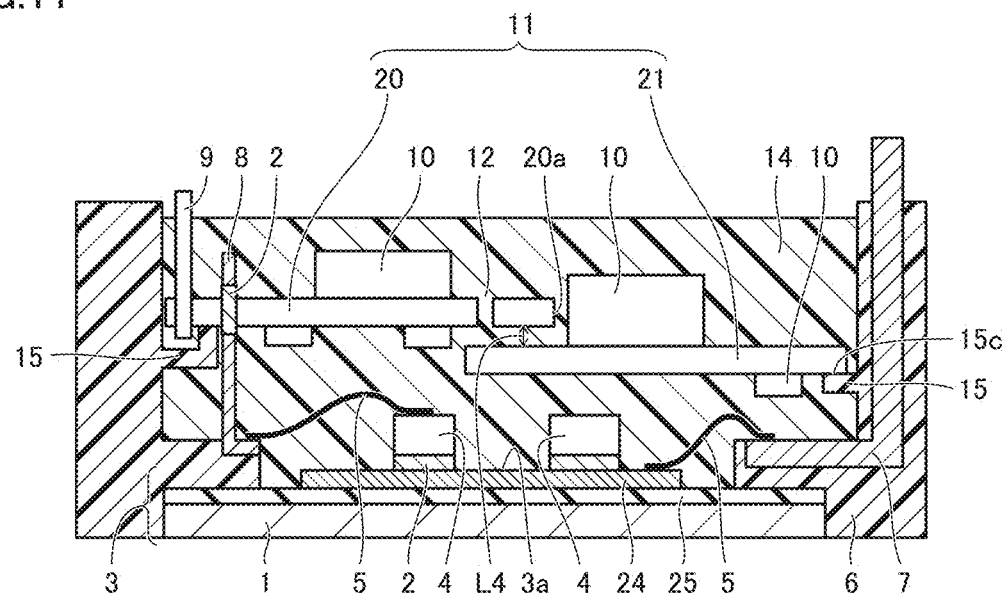
FIG. 11 is a schematic sectional view taken along a line XI-XI in FIG. 10.

FIG. 10 is a sectional plan view illustrating a semiconductor device according to a fourth embodiment. FIG. 11 is a schematic sectional view taken along a line XI-XI in FIG. 10. FIG. 10 corresponds to FIG. 1, and FIG. 11 corresponds to FIG. 3. The semiconductor device in FIGS. 10 and 11 basically has the same configuration as the semiconductor device in FIGS. 1 to 3, but the configuration of wiring board 11 and the configurations of support portions 15, 30a, 30b are different from those of the semiconductor device in FIGS. 1 to 3. That is, in the semiconductor device in FIGS. 10 and 11, wiring board 11 includes two boards of a first board 20 and a second board 21. When wiring board 11 includes a plurality of boards, the number of the boards may be at least three.

Support portion 15 and additional support portion 30a, 30b protruding in a direction intersecting with the protruding direction of support portion 15 from the side wall surface are formed on the side wall of case 6. First board 20 is supported by support portion 15 on the left side in FIG. 10 and additional support portion 30a. Support portion 15 and additional support portion 30a that are in contact with first board 20 have substantially the same height in the direction perpendicular to main surface 3a of base member 3.

The second board 21 is supported by support portion 15 and additional support portion 30b on the right side in FIG. 10. Support portion 15 and additional support portion 30b that are in contact with second board 21 have substantially the same height in the direction perpendicular to main surface 3a of base member 3.

In the direction perpendicular to main surface 3a of base member 3, additional support portion 30a is disposed at the position farther from base member 3 than additional support portion 30b. As can be seen from FIG. 11, an end portion 20a of first board 20 is disposed on second board 21 at a distance L4 from second board 21. When viewed from the direction perpendicular to main surface 3a of base member 3, a part of first board 20 and a part of second board 21 overlap with each other. Distance L4 is preferably smaller than the width of the overlapping portion between first board 20 and second board 21 in planar view in FIG. 10 (when viewed from the direction perpendicular to main surface 3a of base member 3).

A planar shape of each of first board 20 and second board 21 is a quadrangular shape. When the direction along main surface 3a of base member 3 from first board 20 toward second board 21 is defined as a first direction, and when the direction perpendicular to the first direction and along main surface 3a is defined as a second direction, in first board 20, the width in the first direction may be smaller or larger than the width in the second direction. In second board 21, the width in the first direction may be smaller or larger than the width in the second direction.

<Method for Manufacturing Semiconductor Device>

The method for manufacturing the semiconductor device in FIGS. 10 and 11 is basically similar to the method for manufacturing the semiconductor device in FIGS. 1 to 3, but is different from the method for manufacturing the semiconductor device in FIGS. 1 to 3 in the configuration of wiring board 11, the configuration of case 6, and the content of the process of disposing wiring board 11 (S50). Specifically, wiring board 11 prepared in the preparation process (S10) is two boards of first board 20 and second board 21. In addition to support portion 15, additional support portions 30a, 30b are formed on the side wall of case 6. Thereafter, the processes (S20) to (S40) in the method for manufacturing the semiconductor device in FIGS. 1 to 3 are performed. Then, in the process of disposing wiring board 11 (S50), at first, second board 21 is disposed inside case 6 such that the outer peripheral portion of second board 21 is in contact with support portion 15 and additional support portion 30b. Subsequently, first board 20 is disposed inside case 6 such that the outer peripheral portion of first board 20 is brought into contact with support portion 15 and additional support portion 30a. At this time, first board 20 is disposed such that a part of the side of end portion 20a of the first board 20 overlaps with second board 21. First board 20 and second board 21 are not in contact with each other and are disposed at distance L4. Thereafter, the process (S60) and the process (S70) in the method for manufacturing the semiconductor device in FIGS. 1 to 3 is performed, so that the semiconductor device in FIGS. 10 and 11 can be obtained.

Advantageous Effect

In the semiconductor device, wiring board 11 may include first board 20 and second board 21. When viewed from the direction perpendicular to main surface 3a of base member 3, a part of first board 20 and a part of second board 21 may overlap with each other. Distance L4 between first board 20 and second board 21 in the region where first board 20 and second board 21 overlap with each other is preferably smaller than the width of the overlapping portion between first board 20 and second board 21 in planar view in FIG. 10 (when viewed from the direction perpendicular to main surface 3a of base member 3).

In this case, the effects similar to those of the semiconductor device in FIGS. 1 to 3 can be obtained, and the possibility that the substance such as the moisture and the gas reaches semiconductor element 4 from the upper surface of sealing member 14 through the overlapping portion between first board 20 and second board 21 can be decreased.

<Configuration and Advantageous Effect of Modification>

Figure 12:
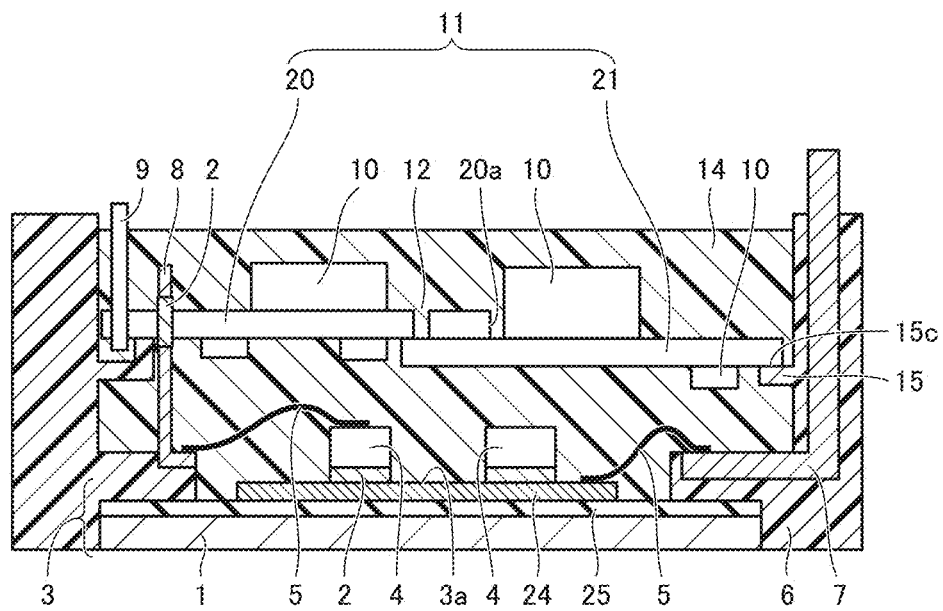
FIG. 12 is a schematic sectional view illustrating a first modification of the semiconductor device of the fourth embodiment.

FIG. 12 is a schematic sectional view illustrating a first modification of the semiconductor device of the fourth embodiment. FIG. 12 corresponds to FIG. 11. The semiconductor device in FIG. 12 basically has the same configuration as the semiconductor device in FIGS. 10 and 11, but is different from the semiconductor device in FIGS. 10 and 11 in that first board 20 and second board 21 are in contact with each other in the region where first board 20 and second board 21 overlap with each other.

In this case, the effects similar to those of the semiconductor device in FIGS. 10 and 11 can be obtained. In the semiconductor device in FIG. 12, first board 20 and second board 21 are in contact with each other, so that the possibility that the substance such as the moisture and the gas reaches semiconductor element 4 from the upper surface of sealing member 14 through the overlapping region can be decreased.

Figure 13:
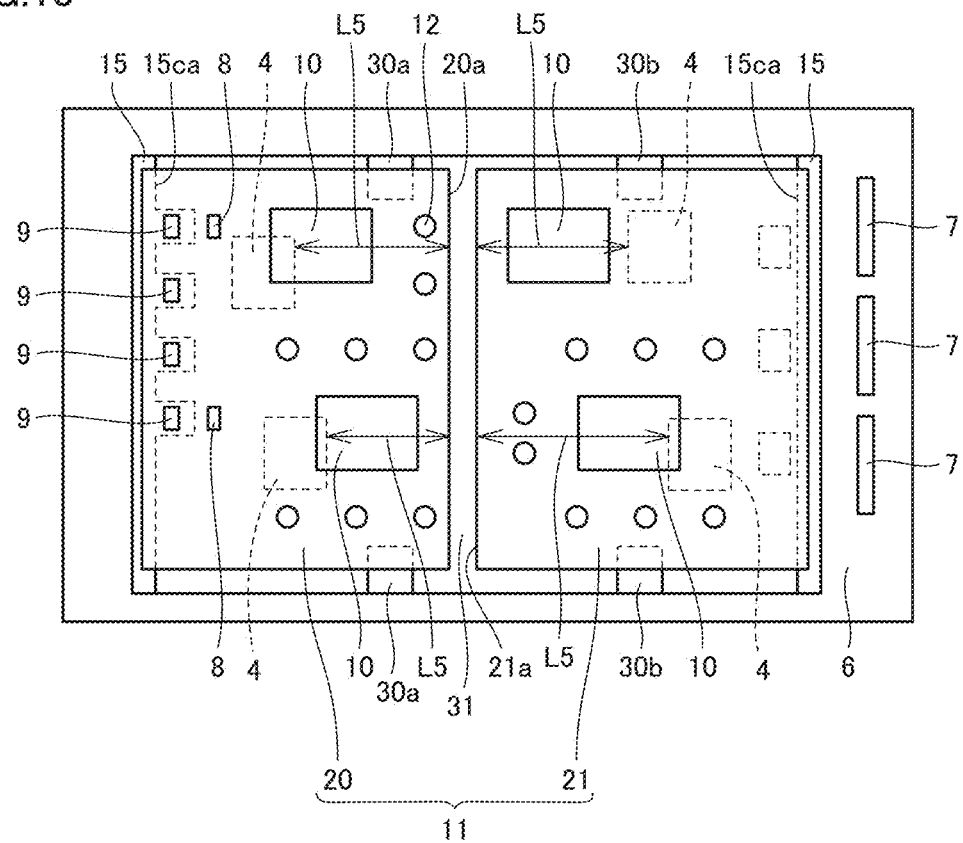
FIG. 13 is a schematic plan view illustrating a second modification of the semiconductor device of the fourth embodiment.

FIG. 13 is a schematic plan view illustrating a second modification of the semiconductor device of the fourth embodiment. The semiconductor device in FIG. 13 basically has the same configuration as that of the semiconductor device in FIGS. 10 and 11, but is different from the semiconductor device in FIGS. 10 and 11 in that first board 20 and second board 21 are disposed at intervals without overlapping with each other in planar view. When viewed from the direction perpendicular to main surface 3a of base member 3, first board 20 and second board 21 are disposed at an interval. End portion 20a of first board 20 and an end portion 21a of second board 21 face each other at an interval. When viewed from the above direction, semiconductor element 4 is disposed at a position not overlapping with a gap 31 between first board 20 and second board 21. A distance L5 between gap 31 and semiconductor element 4 as viewed from the above direction is preferably larger than thickness T1 (see FIG. 1) of sealing member 14 in the above direction.

Summarizing the characteristic configuration of the semiconductor device described above, wiring board 11 may include first board 20 and second board 21. When viewed from the direction perpendicular to main surface 3a of base member 3, first board 20 and second board 21 may be disposed at an interval. When viewed from the above direction, semiconductor element 4 may be disposed at the position not overlapping with gap 31 between first board 20 and second board 21. Distance L5 between gap 31 and semiconductor element 4 as viewed from the above direction may be larger than thickness T1 of sealing member 14 in the above direction.

In this case, distance L5 from gap 31 to semiconductor element 4 is sufficiently secured, so that the possibility that the substance such as the moisture or the gas reaches semiconductor element 4 from the upper surface of sealing member 14 through gap 31 can be decreased.

Fifth Embodiment

<Configuration of Semiconductor Device>

Figure 14:
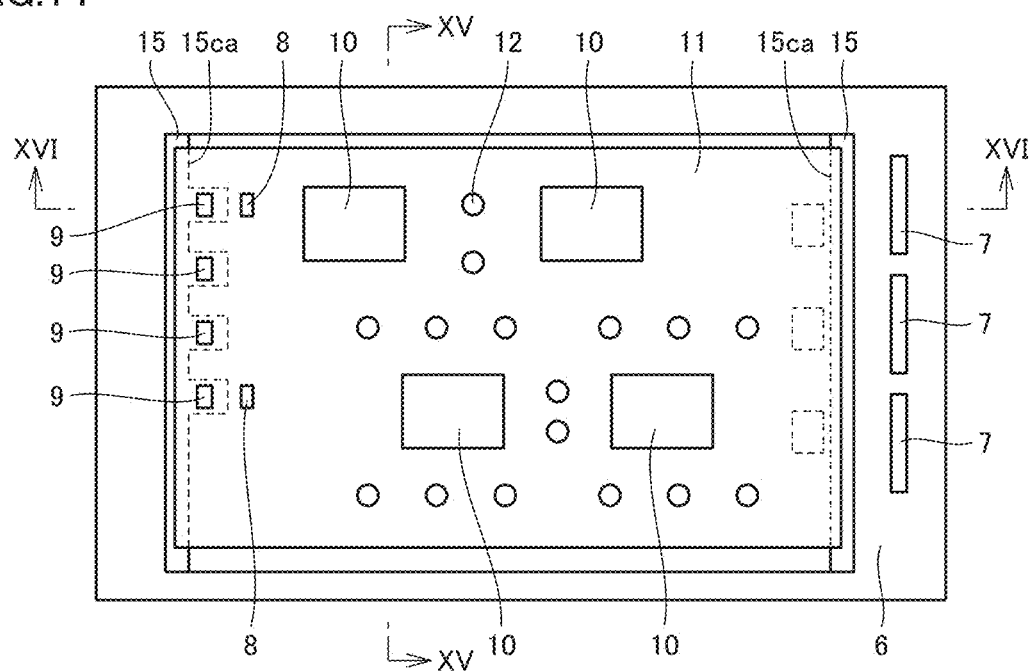
FIG. 14 is a sectional plan view illustrating a semiconductor device according to a fifth embodiment.
Figure 15:
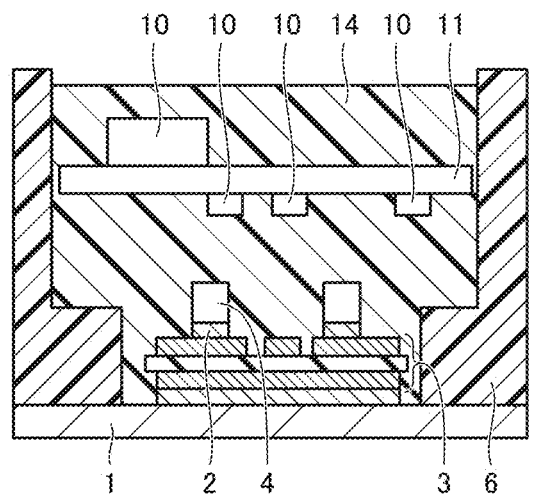
FIG. 15 is a schematic sectional view taken along a line XV-XV in FIG. 14.
Figure 16:
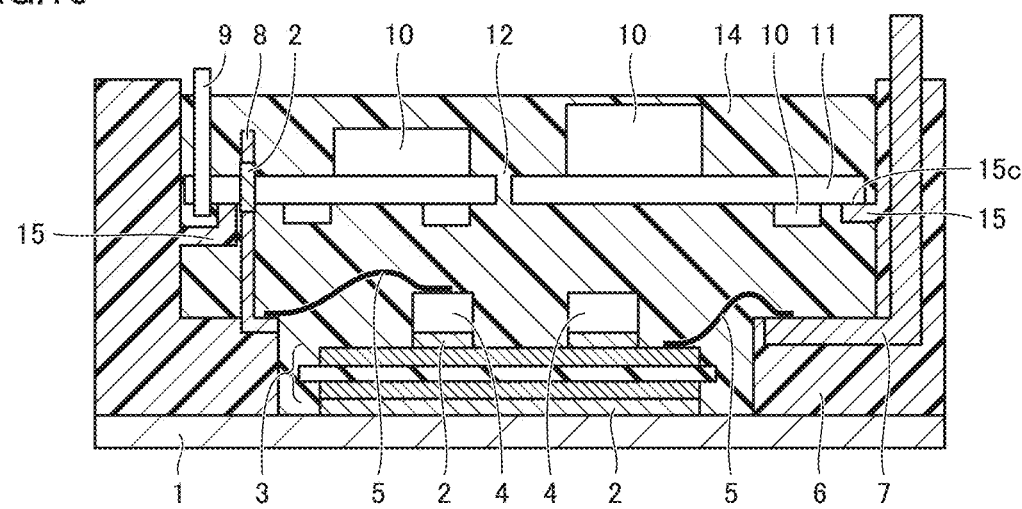
FIG. 16 is a schematic sectional view taken along a line XVI-XVI in FIG. 14.

FIG. 14 is a sectional plan view illustrating a semiconductor device according to a fifth embodiment. FIG. 15 is a schematic sectional view taken along a line XV-XV in FIG. 14. FIG. 16 is a schematic sectional view taken along a line XVI-XVI in FIG. 14. FIGS. 14 to 16 correspond to FIGS. 1 to 3, respectively. The semiconductor device in FIGS. 14 to 16 basically has the same configuration as the semiconductor device in FIGS. 1 to 3, but is different from the semiconductor device in FIGS. 1 to 3 in the configuration of base member 3 and heat dissipation layer 1 as the separate member from base member 3, and that case 6 and base member 3 are connected to each other with heat dissipation layer 1 interposed therebetween. That is, in the semiconductor device in FIGS. 14 to 16, base member 3 includes the insulating layer made of an inorganic ceramic material and the conductor layers connected to the upper surface and the lower surface of the insulating layer. For example, alumina ($Al_2O_3$), aluminum nitride (AlN), silicon nitride ($Si_3N_4$), silicon dioxide ($SiO_2$), or boron nitride (BN) can be used as the inorganic ceramic material. The size of base member 3 is smaller than the size of wiring board 11.

Heat dissipation layer 1 is connected to the conductor layer configuring the lower surface of base member 3 with bonding material 2 such as solder interposed therebetween. Case 6 is connected to the outer peripheral portion of heat dissipation layer 1 with the adhesive (not illustrated) interposed therebetween.

<Method for Manufacturing Semiconductor Device>

The method for manufacturing the semiconductor device in FIGS. 14 to 16 is basically similar to the method for manufacturing the semiconductor device in FIGS. 1 to 3, but is different from the method for manufacturing the semiconductor device in FIGS. 1 to 3 in the configurations of base member 3 and heat dissipation layer 1 and the content of the process (S30) of bonding case 6 to base member 3. Specifically, a multilayer body in which the insulating layer made of an inorganic ceramic material as described above and two conductor layers are laminated is prepared as base member 3 prepared in the preparation process (S10). Heat dissipation layer 1 is connected to base member 3 with bonding material 2 interposed therebetween.

Thereafter, the process (S20) in the method for manufacturing the semiconductor device in FIGS. 1 to 3 is performed. Then, in the process (S30), case 6 is bonded to the outer peripheral portion of heat dissipation layer 1 using the adhesive. Thereafter, the processes (S40) to (S70) in the method for manufacturing the semiconductor device in FIGS. 1 to 3 are performed. In this way, the semiconductor device in FIGS. 14 to 16 can be obtained.

Advantageous Effect

The semiconductor device in FIGS. 14 to 16 may include heat dissipation layer 1 connected to base member 3. In this case, the effect similar to that of the semiconductor device in FIGS. 1 to 3 can be obtained, and heat dissipation layer 1 and base member 3 are prepared as the separate members, so that a degree of freedom in selecting the configuration of the semiconductor device can be increased.

Sixth Embodiment

In the present embodiment, the semiconductor device of any one of the first to fifth embodiments described above is applied to a power conversion device. Although the present disclosure is not limited to a specific power conversion device, the case that the present disclosure is applied to a three-phase inverter will be described below as the sixth embodiment.

Figure 17:
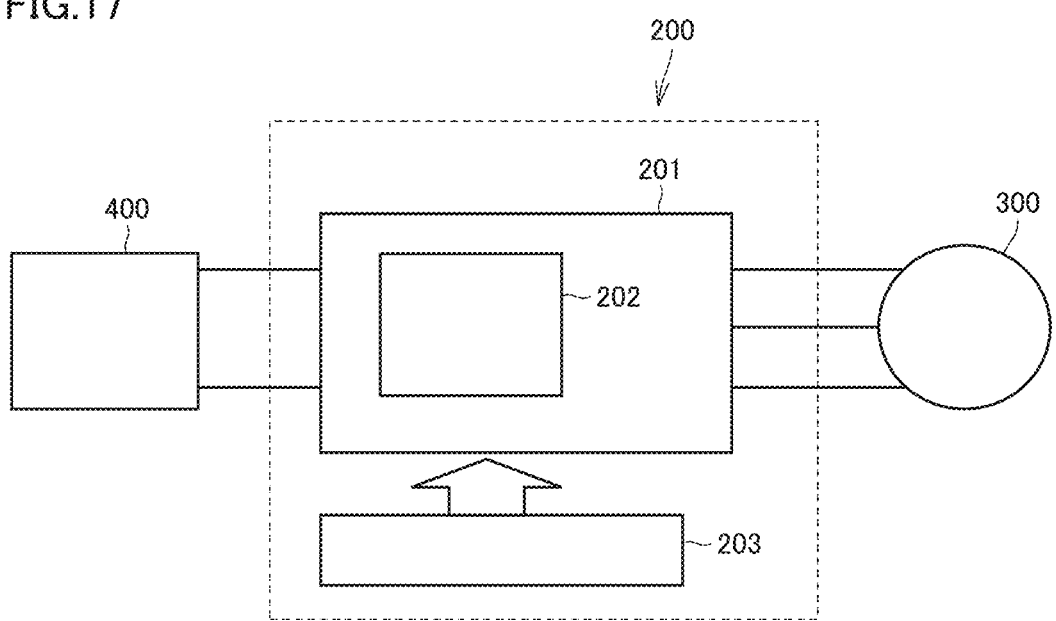
FIG. 17 is a block diagram illustrating a configuration of a power conversion system to which a power conversion device according to a sixth embodiment is applied.

FIG. 17 is a block diagram illustrating a configuration of a power conversion system to which the power conversion device according to the present embodiment is applied.

The power conversion system in FIG. 17 includes a power supply 100, a power conversion device 200, and a load 300. Power supply 100 is a DC power supply, and supplies DC power to power conversion device 200. Power supply 100 can be configured by various components. For example, power supply 100 can be configured by a DC system, a solar cell, and a storage battery, or may be configured by a rectifier circuit connected to an AC system, an AC-DC converter, and the like. Power supply 100 may be constructed with a DC-DC converter that converts the DC power output from the DC system into predetermined power.

Power conversion device 200 is a three-phase inverter connected between power supply 100 and load 300, converts the DC power supplied from power supply 100 into AC power, and supplies the AC power to load 300. As illustrated in FIG. 17, power conversion device 200 includes a main conversion circuit 201 that converts the DC power into the AC power to output the AC power and a control circuit 203 that outputs a control signal controlling main conversion circuit 201 to main conversion circuit 201.

Load 300 is a three-phase motor driven by the AC power supplied from power conversion device 200. Load 300 is not limited to a specific application, but is a motor mounted on various electric appliances. For example, load 300 is used as a hybrid car, an electric car, a rail vehicle, an elevator, or a motor for an air conditioner.

Power conversion device 200 will be described in detail below. Main conversion circuit 201 includes a switching element and a freewheel diode (not illustrated), converts the DC power supplied from power supply 100 into the AC power by switching of the switching element, and supplies the AC power to load 300. Although there are various specific circuit configurations of main conversion circuit 201, main conversion circuit 201 of the present embodiment is a two-level three-phase full bridge circuit, and can be configured by six switching elements and six freewheel diodes connected in anti-parallel to the respective switching elements. At least one of each switching element and each freewheel diode of main conversion circuit 201 is a switching element or a freewheel diode included in semiconductor device 202 corresponding to the semiconductor device of at least one of the first to fifth embodiments. Six switching elements are connected in series in every two switching elements to constitute upper and lower arms, and each upper and lower arm constitutes each phase (U-phase, V-phase, W-phase) of the full bridge circuit. An output terminal of each of the upper and lower arms, namely, three output terminals of main conversion circuit 201 are connected to load 300.

Main conversion circuit 201 includes a drive circuit (not illustrated) that drives each switching element, but the drive circuit may be built in semiconductor device 202, or include the drive circuit separately from semiconductor device 202. The drive circuit generates a drive signal driving the switching element of main conversion circuit 201, and supplies the drive signal to the control electrode of the switching element of main conversion circuit 201. Specifically, the drive signal turning on the switching element and the drive signal turning off the switching element are output to the control electrode of each switching element according to the control signal from control circuit 203 (described later). The drive signal is a voltage signal (ON signal) greater than or equal to a threshold voltage of the switching element when the switching element is maintained in an ON state, and the drive signal is a voltage signal (OFF signal) equal to or smaller than the threshold voltage of the switching element when the switching element is maintained in an OFF state.

Control circuit 203 controls the switching elements of main conversion circuit 201 so that desired power is supplied to load 300. Specifically, time (ON time) during which each switching element of main conversion circuit 201 is to be turned on is calculated based on the power to be supplied to load 300. For example, main conversion circuit 201 can be controlled by PWM control that modulates the ON time of the switching element according to the voltage to be output. A control command (control signal) is output to the drive circuit included in main conversion circuit 201 such that the ON signal is output to the switching element to be turned on at each time point, and such that the OFF signal is output to the switching element to be turned off at each time point. The drive circuit outputs the ON signal or the OFF signal as the drive signal to the control electrode of each switching element according to the control signal.

In the power conversion device of the present embodiment, the semiconductor device of any one of the first to fifth embodiments is applied as semiconductor device 202 configuring main conversion circuit 201, so that the reliability can be improved.

Although the example in which the present disclosure is applied to the two-level three-phase inverter is described in the present embodiment, the present disclosure is not limited to the present embodiment, and can be applied to various power conversion devices. In the present embodiment, the two-level power conversion device is used. However, a three-level or multi-level power conversion device may be used, or the present disclosure may be applied to a single-phase inverter when the power is supplied to a single-phase load. In addition, the present disclosure can also be applied to a DC/DC converter, an AC-DC converter, or the like when the power is supplied to a DC load or the like.

In addition, the power conversion device to which the present disclosure is applied is not limited to the case where the load described above is the electric motor, and can also be used as, for example, a power supply device for an electric discharge machine, a laser beam machine, an induction heating cooker, or a non-contact power feeding system, and can also be used as a power conditioner for a solar power generation system, a power storage system, or the like.

It should be considered that the disclosed embodiments are an example in all respects and not restrictive. As long as there is no contradiction, at least two of the disclosed embodiments may be combined. The basic scope of the present disclosure is defined by not the above description but the claims, and it is intended that all modifications within the meaning and scope of the claims are included in the present invention.

REFERENCE SIGNS LIST

1: heat dissipation layer, 2: bonding material, 3: base member, 3a: main surface, 4: semiconductor element, 5: conductive wire, 6: case, 6a: case surface, 7: external connection terminal, 8: internal connection terminal, 9: terminal member, 9a, 20a, 21a: end portion, 10: electronic component, 11: wiring board, 11a, 11c: surface, 11aa: contact region, 11b: outer peripheral edge, 12: through-hole, 13: sealing member inlet port, 14: sealing member, 15, 30a, 30b: support portion, 15a: notch, 15b: recessed portion, 15c: support surface, 15ca: support surface end portion, 20: first board, 21: second board, 24: conductor layer, 25: insulating layer, 31: gap, 61: side wall, 61a: inner circumferential surface, 100: power supply, 200: electric power conversion device, 201: main conversion circuit, 202: semiconductor device, 203: control circuit, 300: load

The invention claimed is:

1. A semiconductor device comprising:
a base member including a main surface;
a semiconductor element mounted on the main surface of the base member;
a case including a side wall surrounding the base member, a support portion being formed on an inner peripheral surface of the side wall on a base member side;
a wiring board disposed at a position overlapping with the semiconductor element when viewed from a direction perpendicular to the main surface of the base member, an electronic component being mounted on the wiring board, at least a part of the support portion being in contact with a contact region located inside an outer peripheral edge of the wiring board on a surface of the wiring board located on a semiconductor element side;
a sealing member disposed inside the case to seal the semiconductor element and the wiring board; and
a terminal member connected to a region on an outer peripheral edge side with respect to the contact region in the wiring board and including an end portion protruding from a surface of the sealing member, wherein
at least a part of the support portion includes a recessed portion facing a region to which the terminal member is connected in the wiring board.

2. The semiconductor device according to claim 1, wherein an internal connection terminal electrically connected to the wiring board is disposed inside the contact region in contact with the support portion on the surface of the wiring board located on the semiconductor element side.

3. The semiconductor device according to claim 1, wherein a water vapor transmission rate of a material constituting the wiring board and the case is smaller than a water vapor transmission rate of the sealing member.

4. The semiconductor device according to claim 1, wherein
the base member includes a conductor layer to which the semiconductor element is connected, and
a size of a surface of the wiring board on which the electronic component is mounted is larger than a size of the conductor layer.

5. The semiconductor device according to claim 1, wherein
a sealing member inlet port is formed in the wiring board, and
the sealing member inlet port is formed at a position overlapping with the case when viewed from the direction perpendicular to the main surface of the base member.

6. The semiconductor device according to claim 1, wherein
a sealing member inlet port is formed in the wiring board, and
the sealing member inlet port is formed at a position not overlapping with the semiconductor element when viewed from the direction perpendicular to the main surface of the base member.

7. The semiconductor device according to claim 1, wherein
the wiring board includes a first board and a second board, and
a part of the first board and a part of the second board overlap with each other when viewed from the direction perpendicular to the main surface of the base member.

8. The semiconductor device according to claim 1, wherein
the wiring board includes a first board and a second board,
the first board and the second board are disposed at an interval when viewed from the direction perpendicular to the main surface of the base member,
the semiconductor element is disposed at a position not overlapping with a gap between the first board and the second board when viewed from the direction, and
a distance between the gap and the semiconductor element as viewed from the direction is larger than a thickness of the sealing member in the direction.

9. The semiconductor device according to claim 1, wherein
the base member includes a heat dissipation layer, and
a material constituting the heat dissipation layer is metal.

10. The semiconductor device according to claim 1, further comprising a heat dissipation layer connected to the base member.

11. A power conversion device comprising:
a main conversion circuit including the semiconductor device according to claim 1, and to convert and output input power; and
a control circuit to output a control signal controlling the main conversion circuit to the main conversion circuit.

* * * * *